United States Patent [19]

Kaneko

[11] Patent Number: 4,549,151
[45] Date of Patent: Oct. 22, 1985

[54] PULSE WIDTH MODULATOR CIRCUIT WITH THERMAL BREAKDOWN PREVENTION

[75] Inventor: Takashi Kaneko, Tokyo, Japan

[73] Assignee: Nippon Electric Co., Ltd., Tokyo, Japan

[21] Appl. No.: 401,775

[22] Filed: Jul. 26, 1982

[30] Foreign Application Priority Data

Jul. 24, 1981 [JP] Japan .................. 56-116629

[51] Int. Cl.[4] ............................................. H03K 7/08
[52] U.S. Cl. .................................. 332/9 R; 332/9 T;
332/14; 307/265; 328/111; 328/112; 375/22
[58] Field of Search ................. 332/9 R, 9 T, 14;
375/22; 307/265, 266, 267; 328/111, 112

[56] References Cited

U.S. PATENT DOCUMENTS 4,213,103  7/1980  Birt ............................. 375/22 X
4,380,746  4/1983  Sun et al. ..................... 332/14 X Primary Examiner—Eugene R. LaRoche
Assistant Examiner—D. C. Mis
Attorney, Agent, or Firm—Sughrue, Mion, Zinn, Macpeak and Seas

[57] ABSTRACT

A pulse width modulator circuit includes a first comparator comparing an input signal with a sawtooth wave signal, a second comparator comparing a reference voltage with the sawtooth wave signal, an AND circuit receiving the outputs from the first and second comparators, and a reference voltage generator having a series connection of first and second resistors, a reference voltage output terminal being connected to the connection point between the resistors and a capacitor connected in parallel with one of the resistors. It is preferable to connect a switch circuit so that the reference voltage output may be lowered by an electrical switching signal.

13 Claims, 10 Drawing Figures

PULSE WIDTH MODULATOR CIRCUIT WITH THERMAL BREAKDOWN PREVENTION

BACKGROUND OF THE INVENTION

The present invention relates to an improvement of a pulse width modulator circuit (hereinafter, referred to as a PWM circuit). PWM circuits have been widely used in a pulse width modulation type amplifier, a switching regulator and so on.

FIG. 1 is a block diagram of a prior art PWM circuit having an output pulse duty ratio limiting capability. A PWM main part 5 is constructed of an input terminal 1, an amplifier circuit 7, a sawtooth wave oscillator circuit 8, a comparing section 6 composed of comparators 9 and 10 and an AND circuit 11, an output amplifier circuit 12, and an output terminal 2. The potential difference between a power supply line 3 and a reference potential line 4 is divided by serially connected resistors 13 and 14 to apply a reference voltage to a non-inverting terminal 17. The operation of the circuit shown in FIG. 1 will be explained with reference to FIG. 1 and a timing chart in FIG. 2. Here, a duty ratio D of the pulses is defined to be a ratio of the period $T_H$ when the pulse is at a high level to the cycle period $T_o$ of the sawtooth wave, as represented by Equation (1):

$$D = (T_H/T_o) \quad (1)$$

An input analog signal applied to the input terminal 1 is amplified by the amplifier circuit 7 and then applied as a voltage $V_{15}$ to a non-inverting input terminal 15 of the comparator 9 to be compared with the output $V_{16}$ of the sawtooth wave oscillator circuit 8 applied to an inverting input terminal 16. As a result, PWM pulses $V_{18}$ appear at a comparator output line 18. On the other hand, a voltage $V_{17}$ obtained by dividing a potential difference between the power supply line 3 and the reference potential source 4 by the resistors 13 and 14 is applied to a non-inverting input terminal 17 of the comparator 10, while the output of the sawtooth wave oscillator circuit 8 is applied to the inverting input terminal 16. Consequently, pulses $V_{19}$ having a fixed duty ratio $D_o$ appear at an output terminal 19 of the comparator 10. This fixed ratio $D_o$ is determined by the voltage $V_{17}$ applied to the non-inverting input terminal 17. That is, the fixed ratio $D_o$ is the ratio of the time period when the voltage $V_{17}$ is higher than the voltage $V_{16}$ of the sawtooth wave to the cycle period $T_o$ of the sawtooth wave. The PWM pulses $V_{18}$ and the pulses $V_{19}$ are applied respectively to the input of the AND circuit 11 to produce pulses $V_{20}$. The pulses $V_{20}$ have pulse widths modulated by the input signal at the input terminal and have duty ratios equal to or less than the fixed duty ratio $D_o$. After the pulses $V_{20}$ are amplified by the output amplifier circuit 12, a pulse width modulation output is derived from the output terminal.

The comparing section 6 composed of the comparators 9 and 10 and the AND circuit 11 as shown in FIG. 1, may be constructed as shown in FIG. 3 with a constant current source 21, transistors 22, 23, 24, 28 and 30 and resistors 25, 26, 27 and 29 as shown in FIG. 3. This is equivalent to a 3-input comparator having non-inverting input terminals 15 and 17, an inverting input terminal 16 and an output terminal 20. Among inputs applied to the two terminals 15 and 17, a lower input potential is compared with the potential applied to the inverting input terminal 16. One detailed example of the sawtooth wave oscillator circuit 8 is illustrated in FIG. 4. The circuit shown in FIG. 4 consists of a comparator 40, transistors 32 and 36, resistors 31, 34, 35, 37, 38 and 39 and a capacitor 33. The capacitor 33 is charged through the resistor 31 to gradually increase the potential at the terminal 16 when the potential at the terminal 16 is lower than the potential at the connection point of the resistors 34, 35 and 37. On the other hand, when the potential at the terminal 16 is higher than the potential at the connection point, the capacitor 33 is discharged through the transistor 32 which is made conductive by the output of the comparator 40. In response to the discharge, the potential at the terminal 16 drops rapidly. Thereafter, the charging into the capacitor 33 resumes. Accordingly, the sawtooth wave shown in FIG. 2 is obtained as a voltage at the terminal 16.

The PWM circuit having a pulse duty ratio limiting function can protect a switching element or the like, which is provided in the output amplifier circuit or a circuit connected thereafter, from breakdown when a large input signal having an amplitude higher than the sawtooth wave is applied to the terminal 15. More specifically, if the PWM circuit does not provide the pulse duty ratio limiting function, a large input signal will make the switching element conductive for more than a cycle period of the sawtooth wave, and may finally drive it into a thermal breakdown. By limiting the output pulse duty ratio, since the continuously conductive state of the switching element can be prevented, the switching element is protected from thermal breakdown.

However, this pulse duty ratio limiting function cannot protect the switching element from breakdown due to large transients during power-on. During the time immediately after the power is turned on, voltages at many circuit points are not voltages at steady state, and a large current is apt to flow for a long time through the switching element. This is another cause of the switching element's breakdown, but could not be prevented by the prior art.

SUMMARY OF THE INVENTION

Therefore, it is a primary object of the present invention to provide a pulse width mdulator circuit having an improved output element protection function.

It is another object of the present invention to provide a pulse width modulation circuit having an output control function.

According to the present invention, there is provided a pulse width modulation circuit including a power supply line, a reference voltage line, an input terminal receiving an input signal, an output terminal, a sawtooth wave oscillator, a first resistor having an end connected to the power supply line and another end, a second resistor having an end connected to the reference voltage line and another end connected to the other end of the first resistor, a capacitor connected in parallel with the second resistor, a first comparator having a first input receiving the input signal through the input terminal and a second input receiving the output of the sawtooth wave oscillator, a second comparator having a first input connected to the connection point of the first and second resistors and a second input receiving the output of the sawtooth wave oscillator, and an AND circuit having a first input receiving the output of the first comparator, a second input receiving the output of the second comparator and an output connected to the output terminal.

According to another aspect of the present invention, there is provided a pulse width modulator circuit defined above, which further comprises a switching circuit having one end connected to the reference voltage line, another end connected to the connection point of the first and second resistors and an input end receiving a control signal, the electrical connection between the one and other ends being controlled by the control signal.

According to the present invention, in response to the turn on of power, the potential at the connection point of the first and second resistors rises gradually due to the presence of the capacitor. As a result, the pulse duty ratio of the output pulses increases in accordance with the rising potential at the connection point. Therefore, during a transient period after the power is turned on, a current will not flow through the output switching element for an excessively long time, resulting in a protection of the switching element.

Furthermore, the occurrence of the pulse-width-modulated output pulses is easily controlled by the control signal applied to the switching circuit. This control can be done without turning the power off and is achieved by the addition of a minimum number of circuit elements.

BRIEF DESCRIPTION OF THE DRAWINGS

The above and other objects and features of the invention will become more apparent from the following description taken in conjunction with the accompanying drawings, wherein.

DESCRIPTION OF THE PREFERRED EMBODIMENTS

Figure 1:
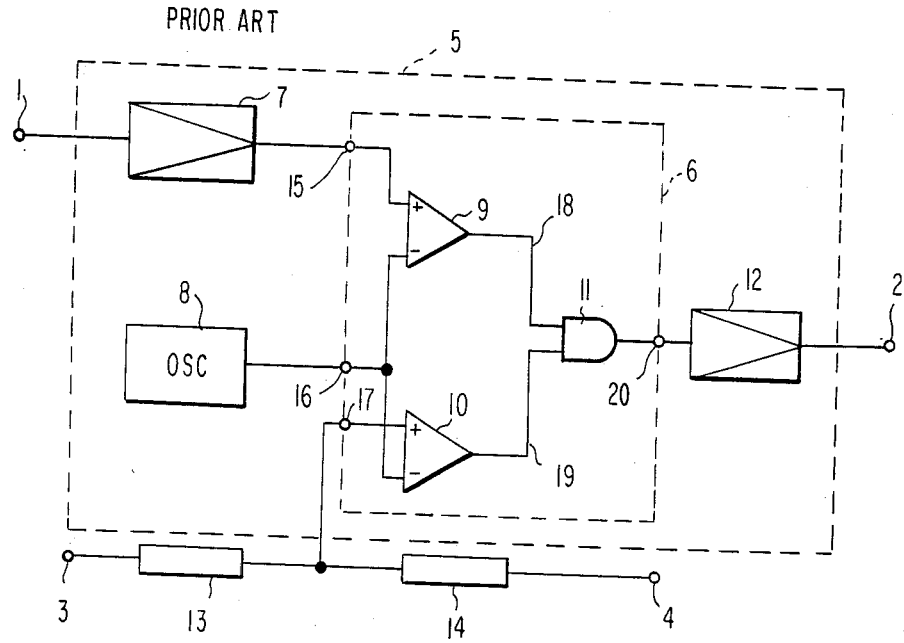
FIG. 1 is a block diagram showing one example of a pulse width modulator circuit in the prior art.
Figure 3:
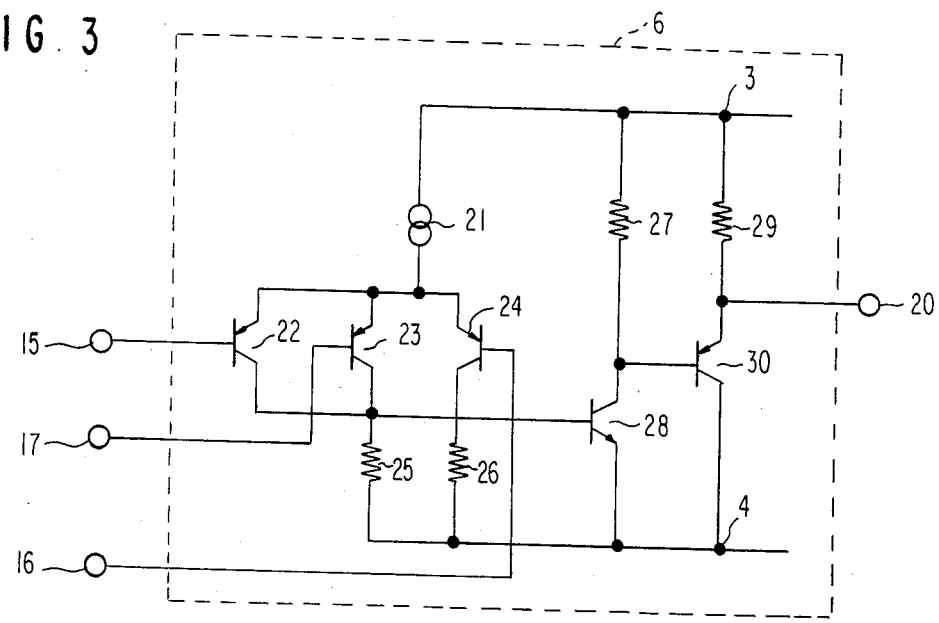
FIG. 3 is a circuit diagram showing one example of the comparing section 6.
Figure 4:
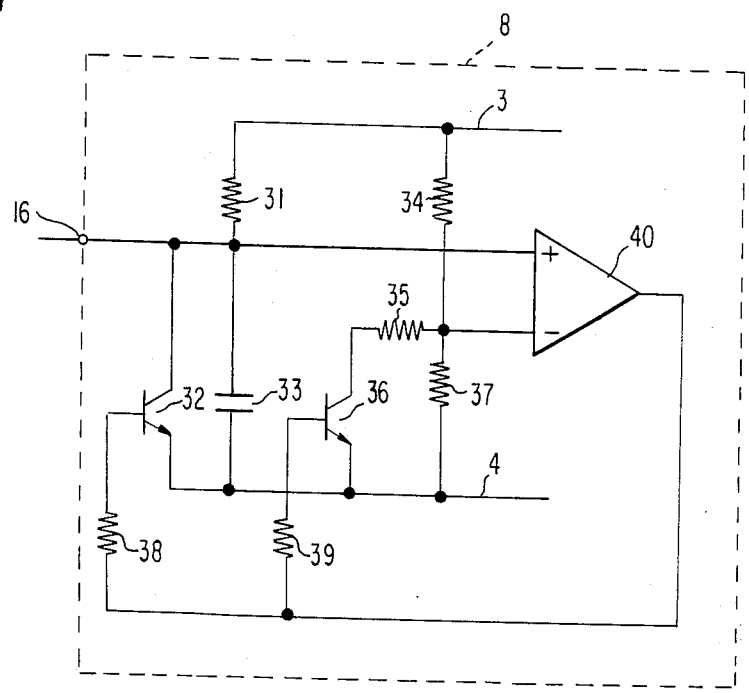
FIG. 4 is a circuit diagram showing one example of the sawtooth wave oscillator circuit 8.
Figure 5:
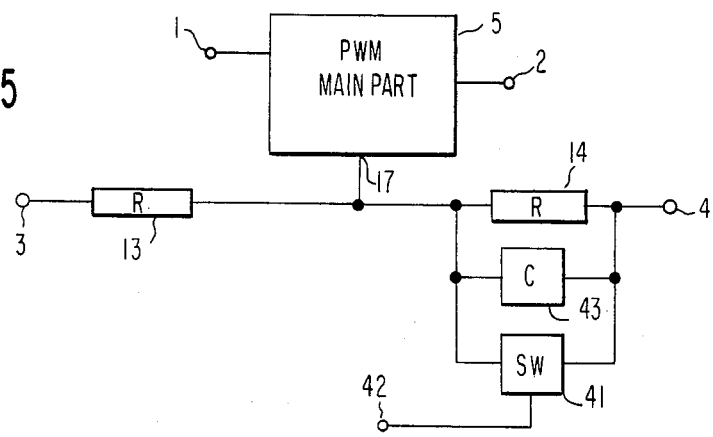
FIGS. 5 and 9 are block diagrams showing respective preferred embodiments of the present invention.

FIG. 5 is a block diagram of one preferred embodiment of the present invention. The PWM main part 5 having the input terminal 1, the output terminal 2 and the terminal 17 may be the same circuit as used in FIGS. 1, 3 and 4, so that a detailed description of the PWM main part will be omitted here. Furthermore, as in the prior art, the series circuit of the resistors 13 and 14 is inserted between the power supply line 3 and the reference potential line 4.

According to a first embodiment, a capacitor 43 and a switch 41 controlled by a signal applied to the control signal terminal 42 are connected in parallel with the resistor 14. The parallel connection of the resistor 14 and capacitor 43 is controlled such that the ends of the parallel connection may be either connected through the elements themselves when the switch is open or directly connected to each other when the switch is closed.

Figure 2:
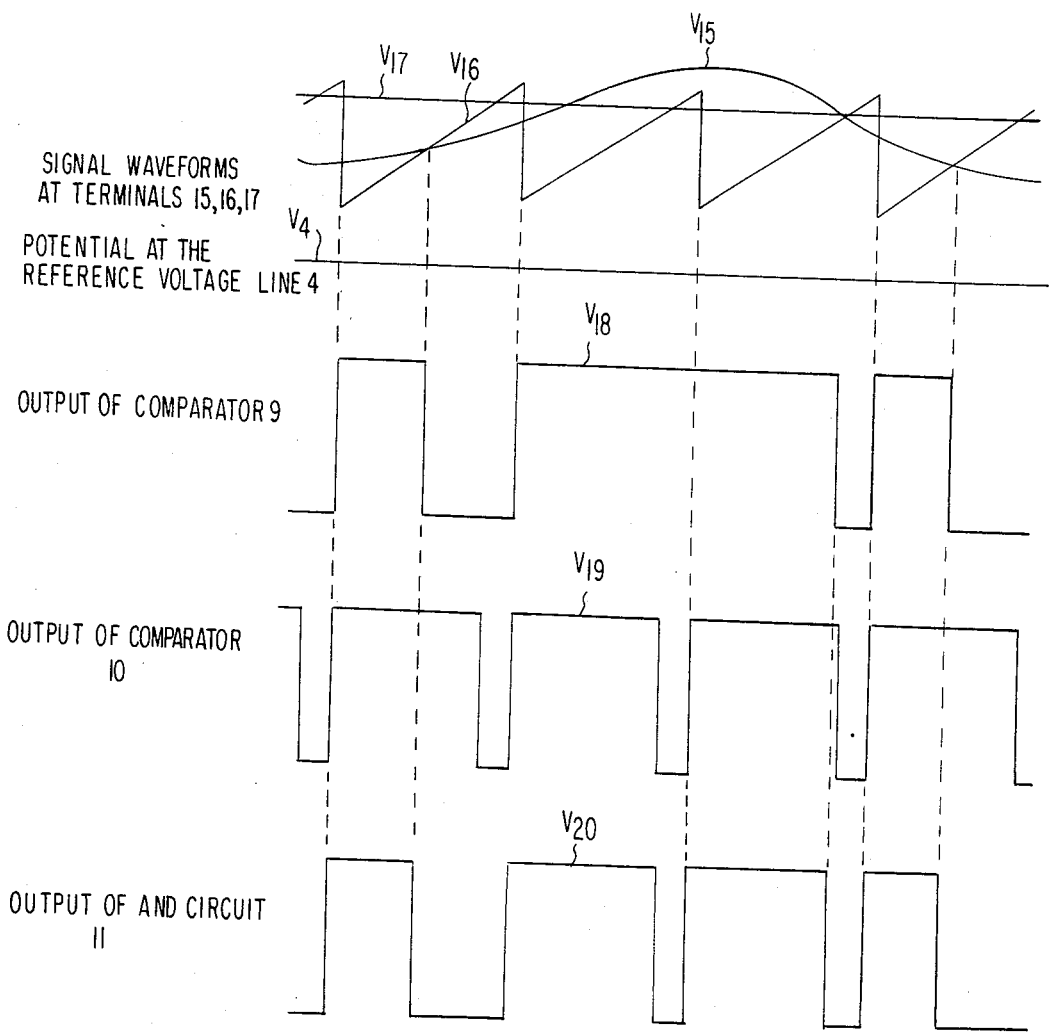
FIG. 2 is a timing chart showing voltage wave forms at various points of the circuit shown in FIG. 1.

In a steady state, the potential at the terminal 17 becomes either one of a high level $V_{17H}$ or low level $V_{17L}$ defined by:

$$V_{17H} = \frac{R_{14}}{R_{13} + R_{14}} (V_3 - V_4) + V_4 \quad (2)$$

$$V_{17L} \approx V_4 \quad (3)$$

where $R_{13}$, $R_{14}$, $V_3$ and $V_4$ represent the resistances of the respective resistors 13 and 14 and the potentials on the power supply line 3 and reference potential line 4, respectively. In this instance, when $V_{17} = V_{17H}$ is fulfilled, the PWM circuit carries out a normal operation as shown in the timing chart in FIG. 2. However, when the potential at the terminal 17 takes the low level $V_{17} = V_{17L}$, the potential at the output terminal 2 is kept at a low level, and thereby the output of the pulse width modulated signal from the output terminal 2 is interrupted. Thus, the control of the pulse width modulated signal from the output terminal is easily achieved by the electrical signal applied to the control signal terminal 42.

Furthermore, during the transient period when the switch 41 changes from off to on or when power is switched on, the potential at the terminal 17 rises gradually from $V_{17L}$, and eventually reaches the final value $V_{17H}$, according to Equation (4) for the potential $V_{17}$ $$V_{17} = \frac{R_{14}}{R_{13} + R_{14}} (V_3 - V_4) \times \left\{ 1 - \exp\left( -\frac{R_{13} + R_{14}}{R_{13} \cdot R_{14}} \times \frac{t}{C} \right) \right\} + V_4 \quad (4)$$

where it is assumed that at $t=0$, either the switch 41 is turned on or power is supplied to the power supply line 3 in a step pulse form. In this case, since the lower of the signals applied to the terminals 15 and 17 is compared with the sawtooth wave at the terminal 16 to obtain pulsewidth modulated pulses at the output terminal 2, and since the potential at terminal 17 will be zero at $t=0$ during the above-mentioned transient period, the pulse width of the pulses at the output terminal 2 is gradually broadened from zero to the steady state pulse width. Owing to such a provision, an abruptly increasing current flowing during the transient period through a switching element or the like which is inserted in the output amplifier circuit 12 or in the stage subsequent to the output terminal 2 can be avoided. According to the system shown in FIG. 5, there is provided a pulse modulation circuit which has a favorable capability whereby, if it is applied to a PWM type amplifier, no click sound is caused by an abruptly increasing current flowing through a switching element at the time of turning switch 41 on or power on, and if it is applied to a PWM type switching regulator, a switching transistor or the like can be protected from breakdown caused by the above-mentioned abruptly increasing current.

Figure 6:
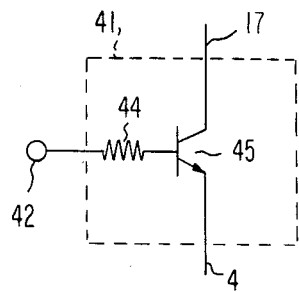
FIGS. 6, 7, 8 and 10 are circuit diagrams each showing one example of the switch 41.
Figure 7:
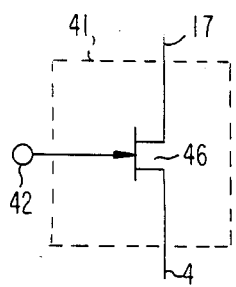
Figure 8:
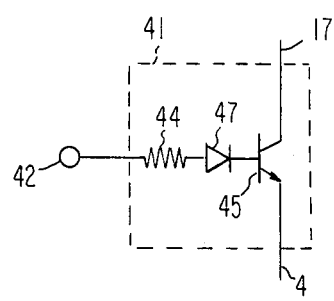

In this arrangement, the switch 41 can be simply constructed of a bipolar transistor 45 and a resistor 44 as shown in FIG. 6, or a field effect transistor 46 as shown in FIG. 7, and it can therefore be realized at a low cost and will occupy a small area. Especially, in the case where the major part of the embodiment shown in FIG. 5 is formed in a semiconductor integrated circuit and the logic level within the semiconductor integrated circuit and the logic level of the control signal applied to the control signal terminal 42 are different from each other, the abovementioned switching of the switch 41 can be easily achieved by adjusting the logic level of the control signal for the switch 41. That is, in the case of the switch 41 shown in FIG. 6, the adjustment can be achieved by inserting a diode 47 between the resistor 44 and the base of the transistor 45, as illustrated in FIG. 8. The threshold value of the switch 41 in FIG. 6 is nearly equal to a base-emitter ON voltage $V_{BE(ON)}$ of the transistor 45, but in the case of FIG. 8 it becomes a value increased by the forward voltage $V_F$ of the diode 47. In this way, adjustment of the logic level at the control input terminal 42 can be achieved easily.

Figure 9:
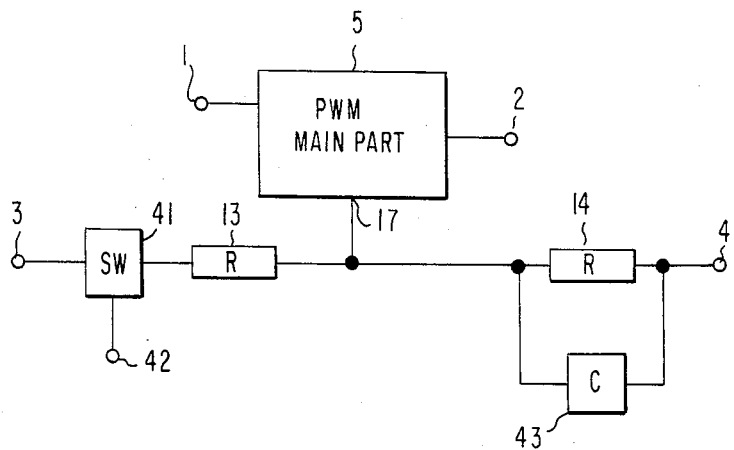
Figure 10:
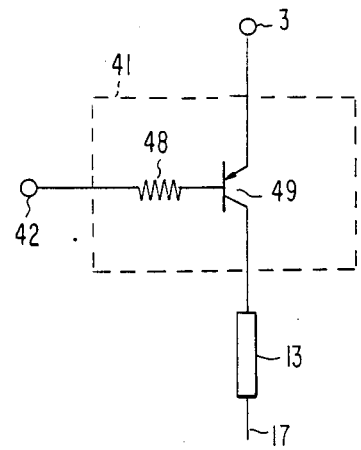

In addition, FIG. 9 shows a block diagram of another preferred embodiment of the present invention. Compared to the embodiment shown in FIG. 5, the embodiment of FIG. 9 is modified such that a switch 41 is inserted between the power supply line 3 and the resistor 13. The switch 41 can be easily constructed of, for example, a transistor 49 and a resistor 48 as shown in FIG. 10. The control input signal in this case is applied with reference to the power supply line 3, and the switch 41 is opened by a high level signal and closed by a low level signal. Thus, the potential at the terminal 17 is controlled in a manner similar to the embodiment shown in FIG. 5, and the output from the output terminal 2 is controlled by the control signal applied to the control signal terminal 42.

As other modifications for controlling the output from the output terminal 2, it would be conceivable to raise the potential at the terminal 16 to a level higher than the level of the normal oscillating state of the sawtooth wave oscillator 8, or to make the wiring at the terminal 20 or 2 an open circuit. However, both cases have a disadvantage that, at the above-mentioned transient time period, the output pulse width cannot be controlled so as to widen gradually. Therefore, these modifications are apt to produce a harsh click noise in a pulse width modulation type amplifier and to cause a breakdown of the switching element.

As described above, according to the present invention, there is provided a pulse width modulator circuit protecting the switching element from a breakdown or preventing a harsh click noise with a minimum increment of circuit elements, a low cost and a small occupation area on a silicon chip. The present invention also provides a pulse width modulator circuit having an easily controllable pulse width. It should be noted that the polarities of the circuit elements could be reversed without departing from the spirit and scope of the invention. In such a case, the reference voltage would be raised to limit the pulse width rather than lowered.

I claim:

1. A pulse width modulator circuit comprising: a power supply line; a reference voltage line; an input terminal receiving an input signal; an output terminal; a sawtooth wave oscillator; a voltage divider including a first resistor having one end connected to said power supply line and another end, a second resistor having one end connected to the reference voltage line and another end connected to said other end of said first resistor, and a capacitor connected in parallel with said second resistor; a switch circuit coupled to said voltage divider and selectively switchable for bringing a voltage at the connection point between said other ends of said first and second resistors to a level close to a voltage at said reference voltage line, said switch circuit including a first end connected to said reference voltage line, a second end connected to said connection point between said first and second resistors and a control terminal receiving a control signal, the conductivity between said first and second ends of said switch circuit being controlled by said control signal; a first comparator having a first input receiving said input signal at said input terminal and a second input receiving the output of said sawtooth wave oscillator; a second comparator having a first input connected to the connection point between said other ends of said first and second resistors and a second input receiving said sawtooth wave oscillator output; and an AND circuit having a first input receiving the output of said first comparator and a second input receiving the output of the second comparator and an output connected to said output terminal, the output of said second comparator being determined by a comparison between the voltage at said connection point and said sawtooth wave oscillator output.

2. A pulse width modulator circuit as claimed in claim 1, wherein said switch circuit comprises a transistor having a conduction path connected in parallel with said capacitor and having a control electrode coupled to said control terminal.

3. A pulse width modulator circuit as claimed in claim 2, further comprising means for producing a constant voltage drop connected in series between said control terminal of said switch circuit and said control electrode of said transistor.

4. A pulse width modulator circuit as claimed in claim 3, wherein said voltage drop means is at least one PN junction.

5. A pulse width modulator circuit as claimed in claim 1, wherein said switch circuit includes a transistor having a common electrode coupled to said first switch circuit end, an output electrode coupled to said second switch circuit end and a control electrode coupled to said control terminal.

6. A pulse width modulator circuit comprising:
an input terminal receiving an input signal;
a first power supply line;
a second power supply line;
a sawtooth wave generator;
a reference voltage generator having a series circuit of a first resistor and a second resistor connected in series, a capacitor connected in parallel with said second resistor, a switch circuit coupled to said series circuit, said series circuit being inserted between said first and second power supply lines, a point at the connection of said first and second resistors producing a reference voltage, and said reference voltage being changed in response to an open state of said switch circuit to a level close to a voltage at one end of said second resistor opposite said first resistor; and
a comparing section having a first terminal connected to said input terminal, a second terminal receiving an output of said sawtooth wave generator, a third terminal receiving said reference voltage and a fourth terminal connected to an output terminal, said comparing section comparing the lower voltage of said input signal and said reference voltage with the output of said sawtooth wave generator, said comparing section further having: a constant current source; a first, a second and a third transistor each having an emitter connected to said constant current source, the base of said first transistor being connected to said first terminal, the base of said second transistor being connected to said second terminal, and the base of said third transistor being connected to said third terminal; and a load having one end connected to both of the collectors of said first and third transistors, said one end of said load being coupled to said fourth terminal, whereby a current from said constant current source flows through said load when said lower voltage of said input signal and said reference voltage is lower than said output of said sawtooth wave generator and otherwise said current from said current source is wasted through said second transistor.

7. A pulse width modulator circuit as claimed in claim 6, wherein said switch circuit includes an electrical path the conductivity of which is controlled by a control signal, said electrical path being connected in parallel with said second resistor.

8. A pulse width modulator circuit as claimed in claim 6, wherein said switch circuit includes an electrical path the conductivity of which is controlled by a control signal, said electrical path being connected in series with said first resistor.

9. A pulse width modulator (PWM) circuit of the type having: an input terminal for receiving an input signal; a reference terminal for receiving a reference potential; and voltage division means including at least a first impedance element and a capacitance element coupled in parallel with each other and coupled in series between said reference terminal and a lower potential and a second impedance element coupled in series between said reference terminal and a higher potential, said PWM providing a signal which is pulse width modulated in accordance with said input signal and having a maximum pulse width limited by said reference potential, the improvement comprising switch means for changing said reference potential in response to a switch control signal to thereby eliminate said pulse width modulated signal, said switch means being coupled in parallel with said first impedance means.

10. A pulse width modulator circuit comprising: a power supply line; a reference voltage line; an input terminal receiving an input signal; an output terminal; a sawtooth wave oscillator; a voltage divider including a first resistor, a switch connected in series with said first resistor and having a control terminal which receives a control signal for controlling connection and disconnection thereof, a second resistor having one end connected to the reference voltage line and the other end connected to one end of the series connection of said first resistor and said switch, and a capacitor connected in parallel with said second resistor, the other end of said series connection of said first resistor and said switch being connected to said power supply terminal; a first comparator having a first input receiving said input signal at said input terminal and a second input receiving the output of said sawtooth wave oscillator; a second comparator having a first input connected to said other end of said second resistor and a second input receiving said sawtooth wave oscillator output; and an AND circuit having a first input receiving the output of said first comparator and a second input reciving the output of the second comparator and an output connected to said output terminal, said sawtooth wave oscillator, said first and second comparators and said AND circuit being supplied with power from said power supply line without passing through said switch.

11. A pulse width modulator circuit comprising:
an input terminal receiving an input signal;
a first power supply line;
a second power supply line;
a sawtooth wave generator;
a reference voltage generator having a series circuit of a first resistor, a switch, and a second resistor connected in series, a capacitor connected in parallel with said second resistor, said series circuit being inserted between said first and second power supply lines, a point at the connection of said first and second resistors producing a reference voltage, said reference voltage being changed in response to an open state of said switch circuit to a level close to a voltage at one end of said second resistor opposite said first resistor, and said switch exclusively controlling the supply of the voltage between said first and second power supply lines to said series circuit; and
a comparing section having a first terminal connected to said input terminal, a second terminal receiving an output of said satooth wave generator, a third terminal receiving said reference voltage and a fourth terminal connected to an output terminal, said comparing section comparing the lower voltage of said input signal and said reference voltage with the output of said sawtooth wave generator, and said first and second power supply lines being directly connected to said comparing section.

12. A pulse width modulator (PWM) circuit of the type having: an input terminal for receiving an input; a reference terminal for receiving a reference potential; and voltage division means including at least a first impedance element and a capacitance element coupled in parallel with each other and coupled in series between said reference terminal and a lower potential and a second impedance element coupled in series between said reference terminal and a higher potential, said PWM providing a signal which is pulse width modulated in accordance with said input signal and having a maximum pulse width limited by said reference potential, the improvement comprising an ON/OFF switch means for changing exclusively said reference potential in response to a switch control signal to thereby eliminate said pulse width modulated signal.

13. A PWM circuit as claimed in claim 12, wherein said switch means is connected in series with said second impedance element between said higher potential and said reference terminal so that the power supply to said PWM except for said voltage division means is not affected by said switch means.

* * * * *